(12) United States Patent
Kantor et al.

(10) Patent No.: US 11,747,129 B2
(45) Date of Patent: Sep. 5, 2023

(54) METHOD FOR OPERATING AN ABSOLUTE MEASURING POSITION DETECTION SYSTEM HAVING A SINGLE-TRACK MAGNETIC CODE OBJECT

(71) Applicant: Balluff GmbH, Neuhausen a.d.F. (DE)

(72) Inventors: Zoltan Kantor, Nemesvamos (HU); Kolos Karoly, Aszofo (HU)

(73) Assignee: BALLUFF GMBH, Neuhausen ADF (DE)

( * ) Notice: Subject to any disclaimer, the term of this patent is extended or adjusted under 35 U.S.C. 154(b) by 2 days.

(21) Appl. No.: 17/200,183

(22) Filed: Mar. 12, 2021

(65) Prior Publication Data

US 2021/0364269 A1    Nov. 25, 2021

(30) Foreign Application Priority Data

Mar. 17, 2020    (DE) ............... 10 2020 107 229.5

(51) Int. Cl.
| | |
|---|---|
| *G01B 7/00* | (2006.01) |
| *G01D 5/12* | (2006.01) |
| *G06N 3/08* | (2023.01) |

(52) U.S. Cl.
CPC ............ *G01B 7/003* (2013.01); *G01D 5/12* (2013.01); *G06N 3/08* (2013.01)

(58) Field of Classification Search
CPC ...... G01B 7/003; G01D 5/12; G01D 5/24461; G01D 5/2492; G01R 33/0094; G01R 33/025; G06N 3/08
See application file for complete search history.

(56) References Cited

U.S. PATENT DOCUMENTS

| | | | | |
|---|---|---|---|---|
| 7,352,294 | B2 * | 4/2008 | Hayashi | G01D 5/2454 341/15 |
| 10,209,097 | B2 * | 2/2019 | Pólik | G01D 5/20 |
| 2017/0344878 | A1 * | 11/2017 | Kántor | G06N 3/10 |
| 2019/0011412 | A1 * | 1/2019 | Jung | H01L 21/28 |

FOREIGN PATENT DOCUMENTS

| | | | | |
|---|---|---|---|---|
| DE | 19513829 | A1 | 10/1996 | |
| DE | 10106479 | A1 | 8/2002 | |
| DE | 10123539 | A1 * | 11/2002 | ......... G01D 5/24404 |
| DE | 10209058 | A1 | 9/2003 | |
| DE | 102011078861 | A | 1/2013 | |
| DE | 102011078861 | A1 * | 1/2013 | ........... G01D 5/2497 |
| DE | 102014224961 | A1 | 6/2016 | |
| WO | WO-2019224400 | A1 * | 11/2019 | ........... G01D 5/2455 |

* cited by examiner

*Primary Examiner* — Giovanni Astacio-Oquendo
*Assistant Examiner* — Dilara Sultana
(74) *Attorney, Agent, or Firm* — GableGotwals

(57) ABSTRACT

In a method for operating an absolute measuring position detection system having a sensor arrangement (100) and a single-track magnetic code object (105) with non-repeating code regions, wherein the sensor arrangement (100) is formed by a substantially linear arrangement of a plurality of magnetic field sensors (110), it is provided in particular that the relative position of the sensor arrangement (100) with respect to the respective code object (105) is determined by searching for a partial pattern which is most similar to a currently sensor-detected partial pattern on the basis of available reference data containing magnetic curve progressions or magnetic patterns of magnetic field vector components detected by sensors for the entire code object (105) depending on the position on the code object (105).

14 Claims, 13 Drawing Sheets

Fig. 2a,b

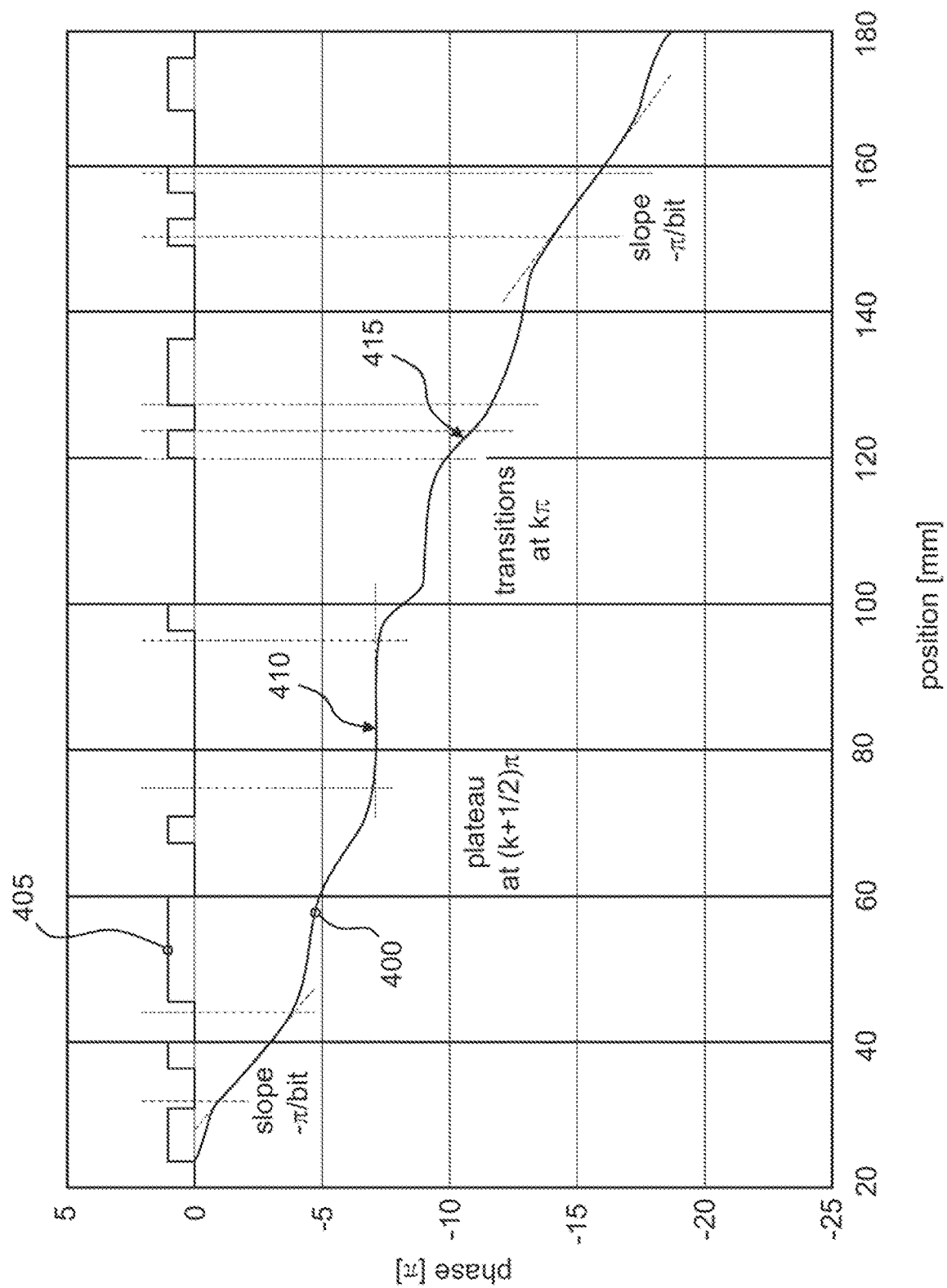

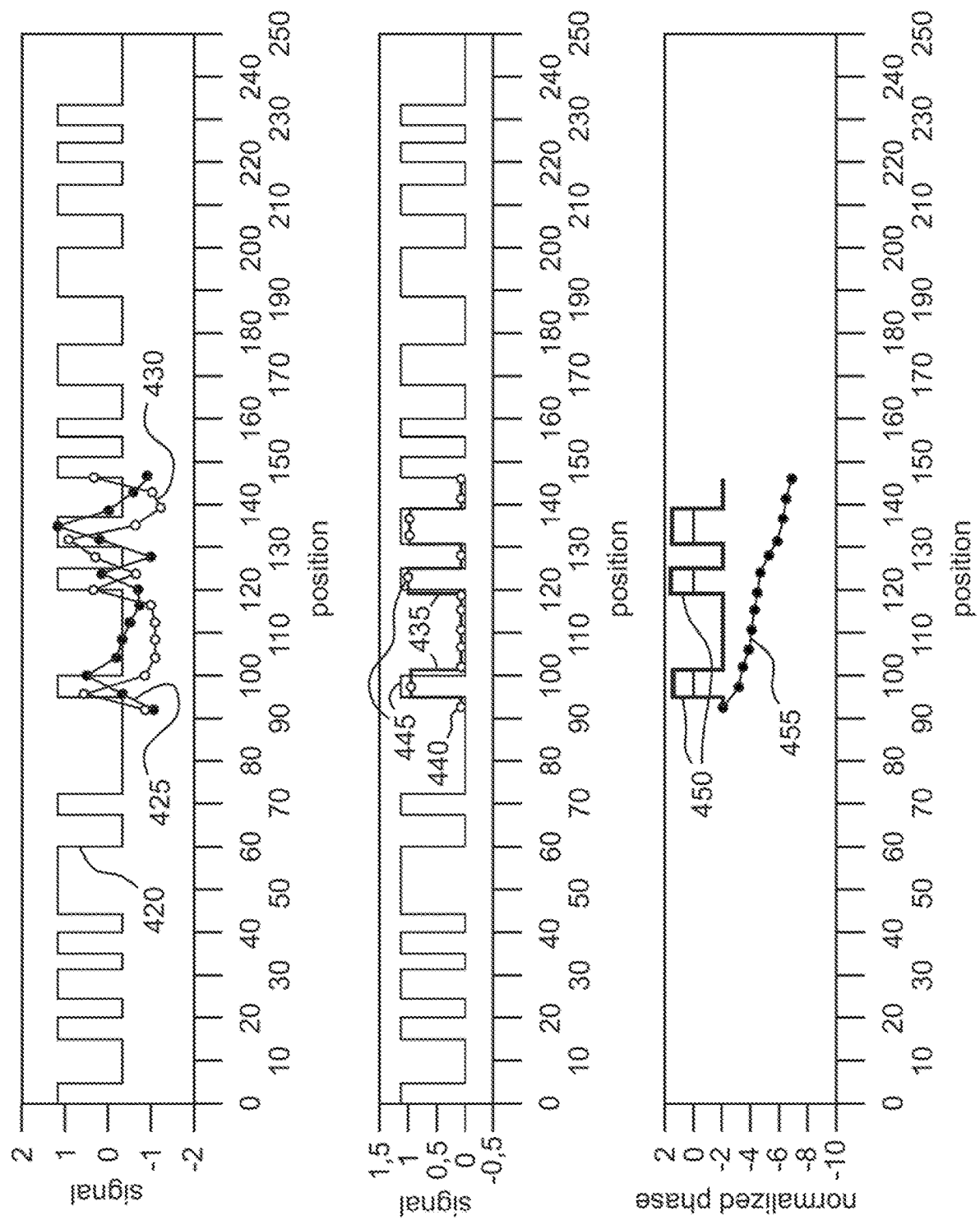

630

1111111111100111000010010000101000101110111101110001100011

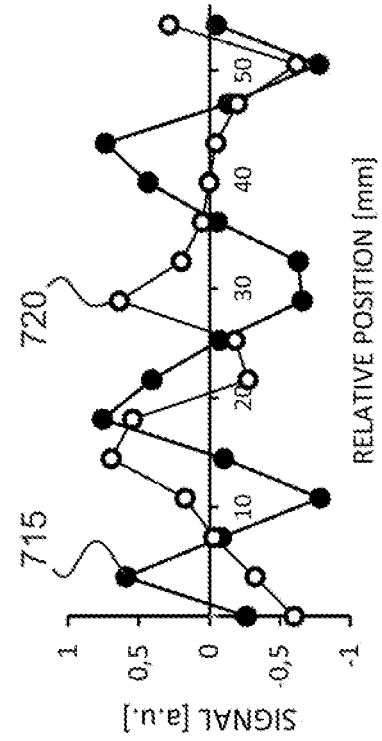
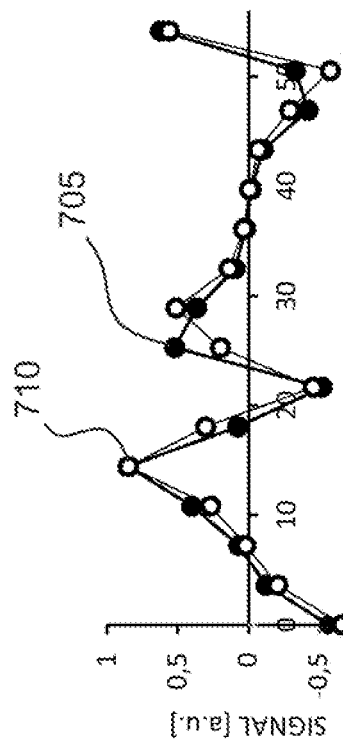
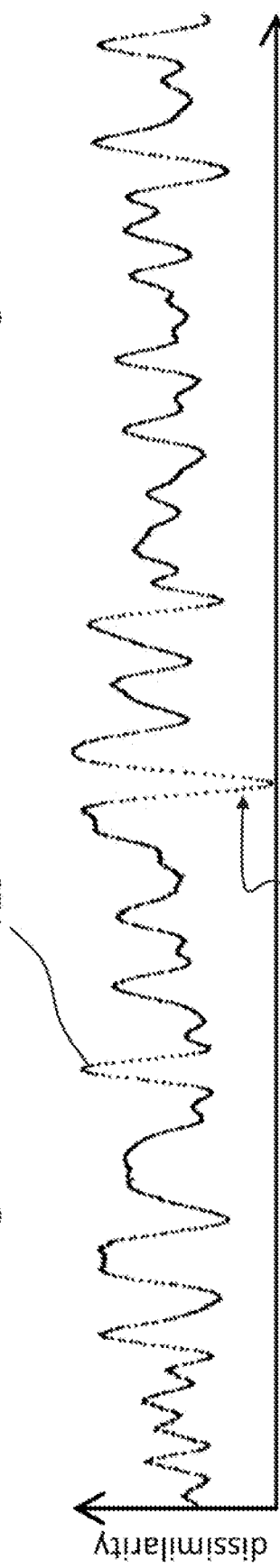
Fig. 7a
Fig. 7b
Fig. 7c
Fig. 7d

METHOD FOR OPERATING AN ABSOLUTE MEASURING POSITION DETECTION SYSTEM HAVING A SINGLE-TRACK MAGNETIC CODE OBJECT

CROSS-REFERENCE TO RELATED APPLICATIONS

This United States application claims priority to German Patent Application No. 102020107229.5 filed 17 Mar. 2020, which is incorporated herein by reference.

The invention relates to a sensor arrangement for an absolute measuring position detection system based on a magnetic code object, e.g. a magnetic code strip or a coded magnetic tape, and in particular to a method for operating such a position detection system as well as a position detection system which can be operated correspondingly.

PRIOR ART

A method for determining the relative position or movement of a physically linear coded bit sequence as well as a corresponding sensor head having an arrangement of sensor elements for detecting corresponding physical parameters are known from DE 195 186 64 C1. The sensor head comprises two sensor elements per bit of the bit sequence.

Furthermore, the present applicant develops and markets on the one hand a magnetic tape position detection system having an incremental position sensor for detecting the exact position of a target object, e.g. a magnetic code strip, wherein two sensor elements detecting a magnetic field are arranged in a line parallel to the magnetic code strips. The distance between these sensor elements corresponds to a quarter of the magnetic pole spacing of the code strips. The SIN/COS position dependence of the components of the respective magnetic field vector is resolved or interpolated by means of an interpolator.

On the other hand, the applicant also develops and markets a magnetic tape position detection system having a position sensor absolutely measuring the position of a target object, e.g. a magnetic code strip, wherein the code strip is divided into two parallel tracks. One track allows incremental measurements with relatively high-resolution position determination within one magnetic period of the code strip. The other track, on the other hand, carries an absolute positioning code encoded as a non-repeating, regular 12-bit or 14-bit sequence of maximum length.

DISCLOSURE OF THE INVENTION

The invention is based on the realisation that absolute measuring magnetic position sensors which are concerned here and based on one or more magnetic code strips are designed for only a single magnetic pattern, e.g. Only a pattern of certain pole width. The corresponding position detection systems are therefore not readily adaptable to different magnetic code objects of uniform bit length. The object of the present invention is thus, firstly, to specify a method for operating a sensor arrangement concerned here which enables the operation of such a sensor arrangement or a corresponding position detection system even in the case of magnetic code objects having different magnetic patterns in each case.

The aforementioned parallel tracks of a code object having e.g. absolute code strips lead to magnetic disturbances of neighbouring magnetic fields, which results in a considerable reduction of the measuring resolution and in a considerably limited possible reading distance between the code strip and the magnetic sensor elements. The object of the present invention is therefore also that such a method also enables the operation of a position detection system having a sensor arrangement concerned here having a greater reading distance.

The aforementioned, inherently known absolute sensors are also very sensitive to misalignments of the sensor elements relative to the code object or the code strip. This applies in particular to a position detection system having a sensor arrangement having sensor elements detecting magnetically in the three spatial directions. According to the three-axis coordinate system shown in FIG. 1, such misalignments can be:

changes in the vertical distance $\Delta z$ between the sensor arrangement and the respective code object in the z-direction shown in FIG. 1, when viewed from the x-direction shown in FIG. 1;

changes in pitch $\alpha_{pitch}$ between the sensor arrangement and the respective code object, when viewed from the y-direction shown in FIG. 1;

changes in the roll angle $\alpha_{roll}$ between the sensor arrangement and the respective code object, when viewed from the x-direction shown in FIG. 1;

changes in the yaw angle $\alpha_{yaw}$ between the sensor arrangement and the respective code object, when viewed from the z-direction shown in FIG. 1;

transverse displacements $\Delta y$ between the symmetry plane of the sensor arrangement and the symmetry plane of the respective code object, when viewed from the x-direction shown in FIG. 1;

vertical tilts of the direction of movement of the sensor arrangement, relative to the respective code object, and thereby induced successive changes $\Delta z$ of the distance between the sensor arrangement and the respective code object along the x-direction, when viewed from the y-direction shown in FIG. 1;

horizontal tilts of the direction of movement of the sensor arrangement, relative to the respective code object, and thus induced successive changes $\Delta y$ of the position of the sensor arrangement relative to the respective code object in the y-direction, when viewed from the z-direction shown in FIG. 1.

The object of the present invention is therefore also that such a method also enables operation of a position detection system having a sensor arrangement concerned here, which is as error-tolerant as possible with respect to the aforementioned misalignments.

Errors occurring in the code strip(s), e.g. due to mechanical wear or due to changes in magnetisation, such as undesired reversal of magnetism of individual magnetic poles, lead to a reduction in the measurement resolution or even render the entire position detection system unusable. The object of the present invention is therefore also that such a method for operating a position detection system having a sensor arrangement concerned here can also be adapted to such changes in the respective magnetically encoded target or measurement object.

In sensor applications having a circularly curved code strip, it must always be ensured that the circumference of the respective code strip is an integer multiple of the respective bit width. It is therefore also an object of the present invention to specify such a method for operating a position detection system having a sensor arrangement concerned here, which is also compatible with any diameter of such a code strip.

According to a first aspect, the invention proposes, in particular for solving the aforementioned objects, a method for operating an absolute measuring linear position detection system concerned here, wherein the position detection system has a substantially linear arrangement of a plurality of magnetic field sensors and a single and single-track magnetic code object having non-repeating code regions, e.g. a magnetic code strip or tape having a uniform bit length of the bit patterns encoded on the code strip.

It should be noted here that the occurrence of substantially uniformly magnetised regions of substantially equal length is a prerequisite for an operation based on the identification of bits ("bitmap"). Although identification of the actual position of a sensor head concerned here based on a minimal dissimilarity between an actual measured pattern and bit patterns previously stored in a reference map based on field vector components, phase etc., is very reliably possible for bit-sequential magnetic code objects, the respective code object does not need to be so regularly formed. Rather, the code object should only be a magnetic object in which magnetic patterns, which, like the sensor head itself, are substantially non-magnetically shorted, do not repeat.

In the proposed method, it is in particular provided that the relative position of the sensor arrangement with respect to the respective code object is determined by searching for the partial pattern of a detected magnetic field signal of a present complete measurement curve which is most similar to a predetermined pattern. As a measure of the similarity, an inherently known correlation technique, e.g. the search for a minimum of the squared deviations between the two signals to be compared by means of the inherently known method of "smallest squares", can be applied.

Other possible methods for determining the one similarity or distance measure are other metrics, such as the sum of the absolute values of the differences, rather than the sum of the squares of the differences. Even with these methods, it is advantageous if the two patterns to be compared are normalised before the dissimilarity test is performed, to reduce the influence of the distance between the sensor and the code object in the z-direction as much as possible.

Another possibility to determine the distance measure is the application of an artificial neural network, which has been previously trained with respect to the estimation of the distance between possible detection positions of the two patterns to be compared.

According to a further aspect, said partial patterns are automatically learned by the position detection system, e.g. during an automatically performed installation of the system. In doing so, the system creates or learns maps of a given code object, and indeed spatial profiles of partial patterns which collectively describe the magnetic field along a single-track code object, e.g. code tape.

According to a further aspect, in normal operation of the position detection system, the relative position of the sensor arrangement with respect to the code object is determined by searching for the part or the partial pattern in the map generated by said learning method which is most similar to a currently detected pattern.

According to a further aspect, the position detection system can also perform self-diagnosis based on the respective quality of similarity or match.

According to a further aspect, the learned maps can be relearned during operation of the system in case of any changes, e.g. due to damage of the code object. In this way, said misalignments between the sensor arrangement and the code object can be reliably detected.

According to a further aspect, the learned maps preferably comprise values of the magnetic field vector components and the respective phase angles. In particular, the maps can be learned or extended or renewed during normal operation, i.e. during movement of the sensor arrangement. The new partial patterns learned in this way are learned after successful localisation of a partial pattern, based on the corresponding partial patterns of the map which are already known.

With respect to said phase information, it can be further provided that a corresponding bit pattern is generated from at least two magnetic field vector components which are detected by sensors and phase-shitted with respect to each other, taking into account a phase progression. The at least two field vector components which are detected by sensors and phase-shifted with respect to each other can be brought into as good a phase-related match as possible by means of a linear integral transformation in order to generate a corresponding bit pattern.

It should be noted for this that the primary aim of the proposed method or position detection system is to use sensor elements with uniaxial sensory detection as far as possible or, in the case of a sensor element with multi-axial sensory detection, to read out only one vector coordinate per sensor element and to calculate or simulate the pattern detected in this way with respect to the respective other vector component by means of a Hilbert transformation. As a result, the operating speed of the position detection system can be significantly increased.

According to yet another aspect, the position detection system can already operate in normal mode during learning, wherein the learning procedure, which is preferably performed continuously, can maintain or even improve the measurement resolution or the measurement characteristics of the system throughout its whole lifetime. Moreover, by means of the learning procedure, operation under changing measurement conditions is also possible.

It should be noted that, in the present context, a so-called "magnetic code" represents a magnetic bit sequence, wherein longitudinally arranged zones with substantially equal bit length correspond to bits of the bit sequence, and the direction of magnetisation of each zone is determined by the value of the corresponding bit. Such zones of substantially equal bit length are referred to herein as "magnetic bits". The zones themselves are substantially magnetically homogeneously polarised, wherein the polarisation direction is perpendicular to the surface of the code tape, and wherein the polarisation of the zones is of substantially equal strength, but in opposite directions for binary '0' and '1' values respectively.

A "bitmap" in the present context is a bit sequence stored in the memory of the sensor device to represent binary values corresponding to the respective bit sequence of said magnetic bits of the code tape.

A position detection system concerned here identifies values of magnetic bits in the range of their length, i.e. in the manner of a correspondingly detected bit sequence, and determines the position of each 0→1 and 1→0 bit transition along the longitudinal axis of the code tape, with respect to the coordinate system of the sensor arrangement. The position of said bit transitions can occur with an accuracy of better than ¼ bit length of a magnetic bit.

A position detection system concerned here locates the bit sequence detected at the respective code object in a mentioned bitmap and calculates therefrom the rough absolute position of the sensor arrangement along the code object as a mathematical product of the magnetic bit width and the sequence number of the respective first bit of the observed sequence within the bitmap.

A position detection system concerned herein further calculates the absolute position from the bit sequence detected at the code object as the sum of the rough absolute position and the starting position of the first bit of the observed bit sequence in the coordinate system of the sensor arrangement.

The proposed method for operating a sensor arrangement concerned here or a corresponding position detection system has in particular the following technical effects or advantages resulting therefrom:
- the position detection system can easily be adapted to the respective (magnetic) environment by the method and can be calibrated without an external reference system;
- the position detection system has a high error tolerance due to the method, as it can restore proper operation itself in case of various damages, misalignments and malfunctions;
- the method enables a very robust operation of the sensor arrangement or the position detection system;
- the sensor arrangement or the position detection system can still be operated very reliably by the method even in the case of extreme misalignments, e.g. with respect to pitch, roll and/or yaw or in the case of spatial displacements in the three spatial directions of the sensor elements or the sensor arrangement with respect to the respective code object;
- by means of the method, the sensor arrangement or the position detection system can be used with any code objects, e.g. with absolute or incremental code strips or tapes;
- the position detection system can also be operated reliably with manually created code tapes by means of the proposed learning method, as well as with code tapes damaged, for example, by reversal(s) of magnetism;
- the sensor arrangement or the position detection system can be used by the method without restrictions with respect to the diameter of circular code objects.

BRIEF DESCRIPTION OF THE FIGURES

FIGS. 4a, b show typical measurement curves obtained with a sensor arrangement of a position detection system concerned here with phase transitions shown in FIG. 3 as well as corresponding position data (4a) and bit patterns (4b) detected on these measurement curves;

FIGS. 7a-d show an exemplary embodiment of the procedure according to the invention for finding a partial pattern stored on a mentioned map based on a similarity comparison;

DETAILED DESCRIPTION OF THE EXEMPLARY EMBODIMENTS

Figure 1:
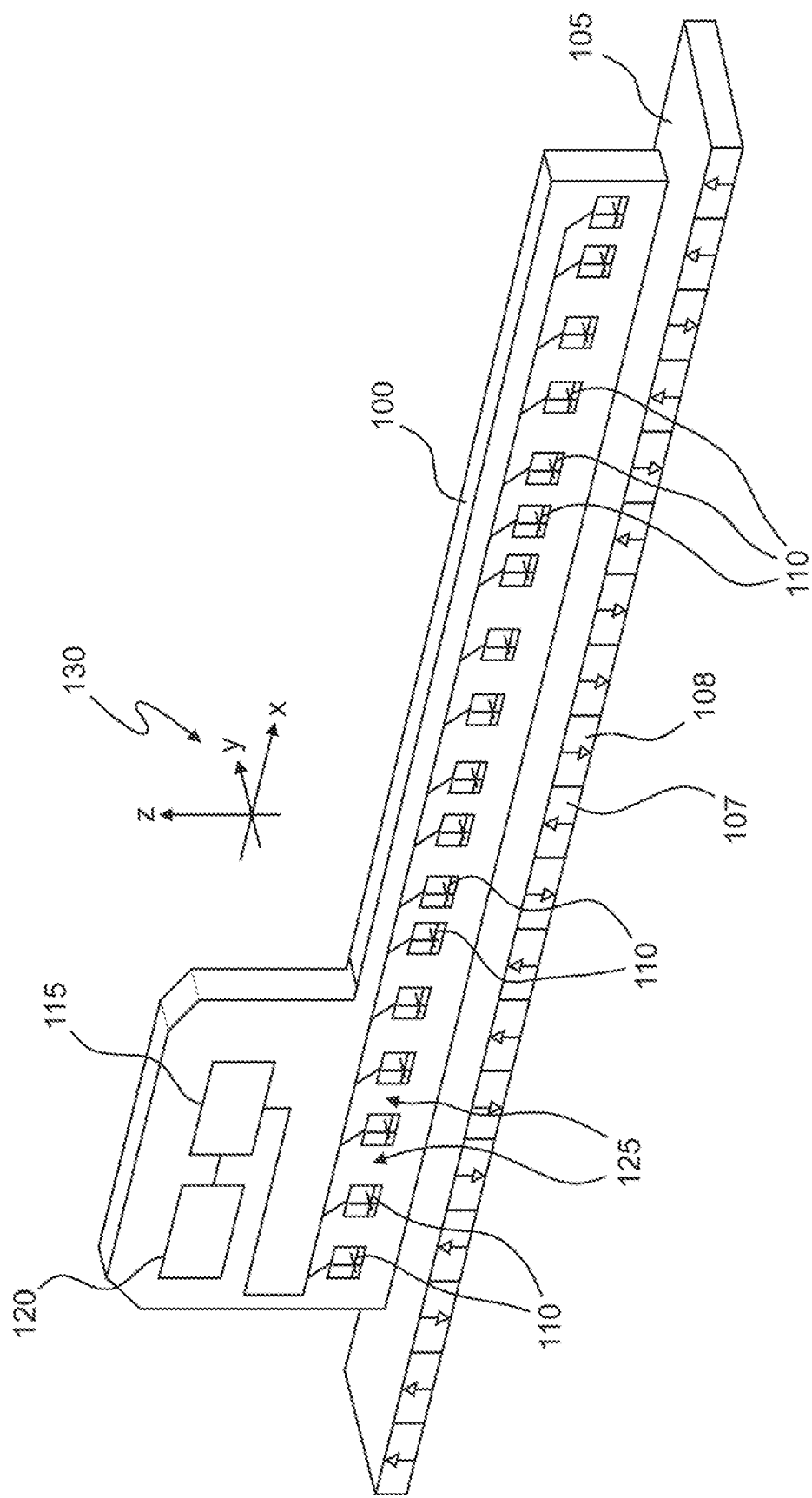
FIG. 1 shows a position detection system concerned here in a schematic, isometric depiction.

The sensor arrangement (or sensor head) 100 shown in FIG. 1 and the magnetic target object shown there, in the present case a stretched magnetic code tape 105, together form a linear, absolute measuring position detection system.

The magnetic code tape 105 has a plurality of magnetic poles, with either the pole direction upwards 107 or the pole direction downwards 108. The linear arrangement of these different poles in the x-direction represents the encoding of the magnetic code tape 105.

The sensor arrangement or the sensor head 100 has a plurality of, in the present exemplary embodiment, eighteen (18) magnetic field sensor elements 110, which are irregularly spaced apart in the x-direction as indicated by the arrows 125. The sensor head 100 also includes a measurement unit and digital signal processing unit (DSP unit) 115, and a digital communication interface 120.

Additionally, the typical spatial arrangement of the axes of a coordinate system 130 of the sensor arrangement 100 with respect to the magnetic code tape 105 provided in the present exemplary embodiment is marked.

The measurement/DSP unit 115 arranged on the sensor arrangement detects and processes the raw signals from the magnetic field sensor elements 110 and communicates with external devices (not shown here) via a digital communication interface 120, namely for transmitting sensor data, parameter data and diagnostic data. The magnetic field sensor elements 110 are designed to be magnetically sensitive, in particular in two axes, in order to be able to perform a phase evaluation of the measurement signals as mentioned and described in more detail below.

The magnetic field sensor elements 110 have in particular the following technical properties or features:
- they are designed to be substantially equal;
- they are arranged in the direction of movement of the sensor elements along the mimetic code object;
- depending on the spatial configuration of the code object or the movement trajectory of the respective target object to be detected, they are arranged either along a straight line or along a curved trajectory;
- they are arranged either with a substantially constant distance between the individual sensor elements thereof or with different or varying distances between the individual sensor elements;
- they each have at least two sensitive axes for detecting the magnetic field generated by the magnetic target object. The sensitive axes thereby span a plane substantially coincident with both the arrangement of the magnetic field sensor elements and a line connecting the arrangement of the magnetic field sensor elements and the centre of the respective magnetic target object. Said centre is either the centreline of a magnetic code tape or the centre of a discrete magnet, depending on the type of target object.

However, the sensor arrangement proposed herein can also be applied to sensor elements which detect magnetically only on a single axis. Also, the sensor arrangement can (optionally) still have a third, sensitive axis oriented substantially perpendicularly to the first two axes.

In particular, the signal processing unit 115 has the following technical properties or features:
- it has a programmable component, e.g. a microcontroller, an FPGA or similar, or a combination of such components, as well as an operational memory, e.g. a RAM, which is as fast as possible, and a rewritable, non-volatile memory, e.g. a FLASH, FRAM or similar;
- it cyclically reads out the signal from the magnetic field sensor elements;
- it converts the signals detected by sensors into a series of regular sensor signals in a self-regulating manner, so to speak, by eliminating, small sensory differences between the magnetic field sensor elements of the sensor arrangement by means of a background correction and by means of a gain compensation, e.g. on the basis of a spatial rotation of the rectified signals with respect: to the coordinate system of the sensor arrangement;
- it determines, based on the detected sensor signals, the relative position of the sensor arrangement or sensor head with respect to the magnetic target object;
- it provides diagnostic information and tools for installation, maintenance and normal operation of the position detection system;
- it is capable of communicating bidirectionally with external devices via a digital interface.

Figure 2:
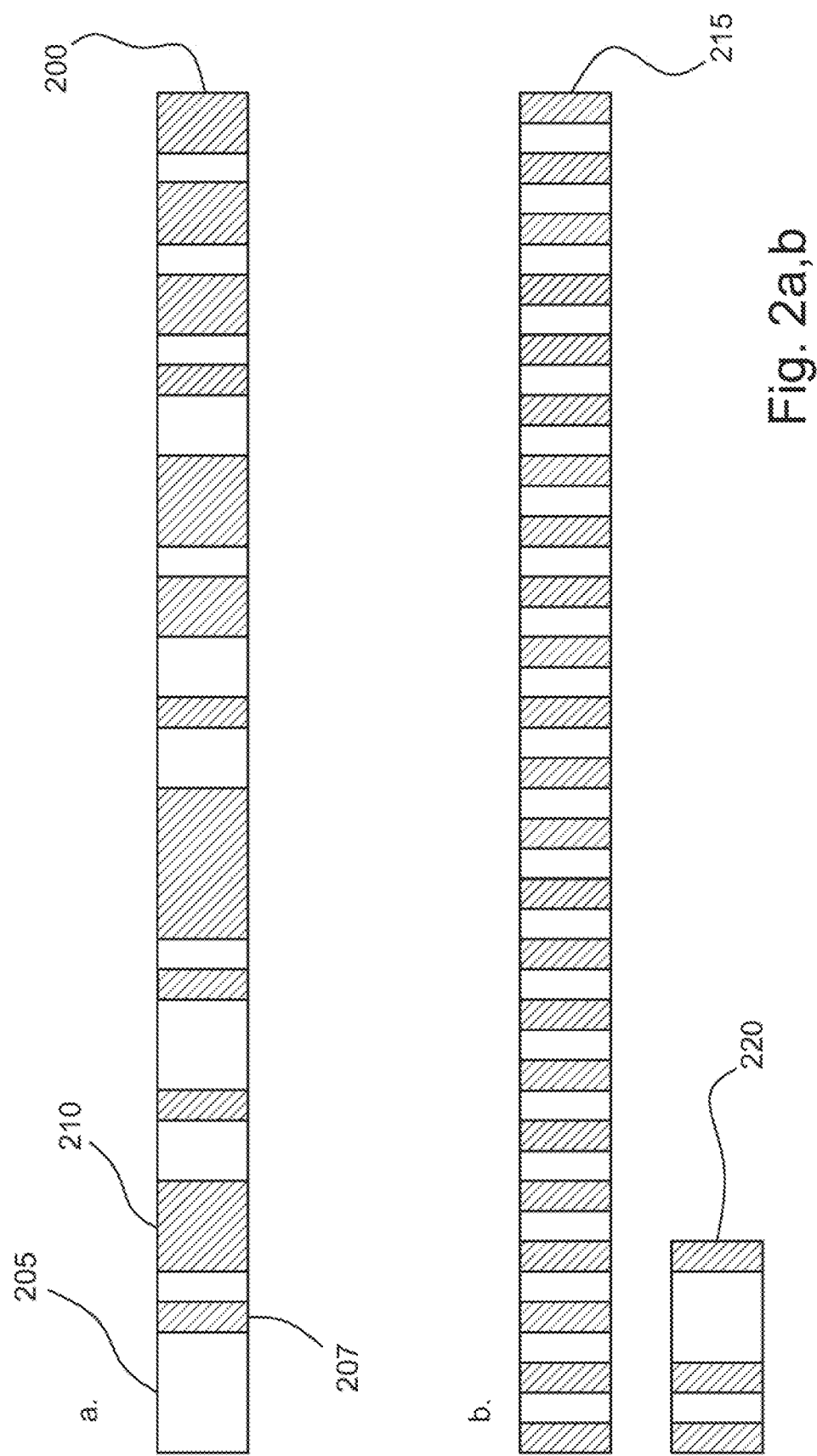
FIGS. 2a, b schematically show two possible designs of a magnetic code tape or strip concerned here.

FIGS. 2a and 2b schematically illustrate two exemplary magnetic code tapes (or magnetic code strips) of a position detection system concerned here.

The absolute code tape shown in FIG. 2a has only a single track 200 having an absolute code having a uniform bit length. The absolute code is composed of a linear arrangement of poles with pole direction (see FIG. 1) upwards 205 as well as with pole direction downwards 210. Thus, the coding shown comprises both single poles 207 surrounded by poles of different polarity and multiple poles, i.e. multiple connected poles of the same polarity 205, 210.

In contrast, the code tape shown in FIG. 2b, which is also suitable for the sensor arrangement according to the invention or a corresponding position detection system, has both a uniform, incremental bit length code 215 and a relatively short code segment 220 or a corresponding code target object having a bit code also of uniform bit length in each case.

According to FIGS. 2a and 2b, only a single absolute code track 200, 220 is required in each case according to the invention. This has various advantages with respect to the magnetic code strip. First, it results in lower manufacturing costs and also total operating costs compared to the prior art. In addition, it results in simpler installation as well as greater tolerances to assembly inaccuracies.

Figure 3:
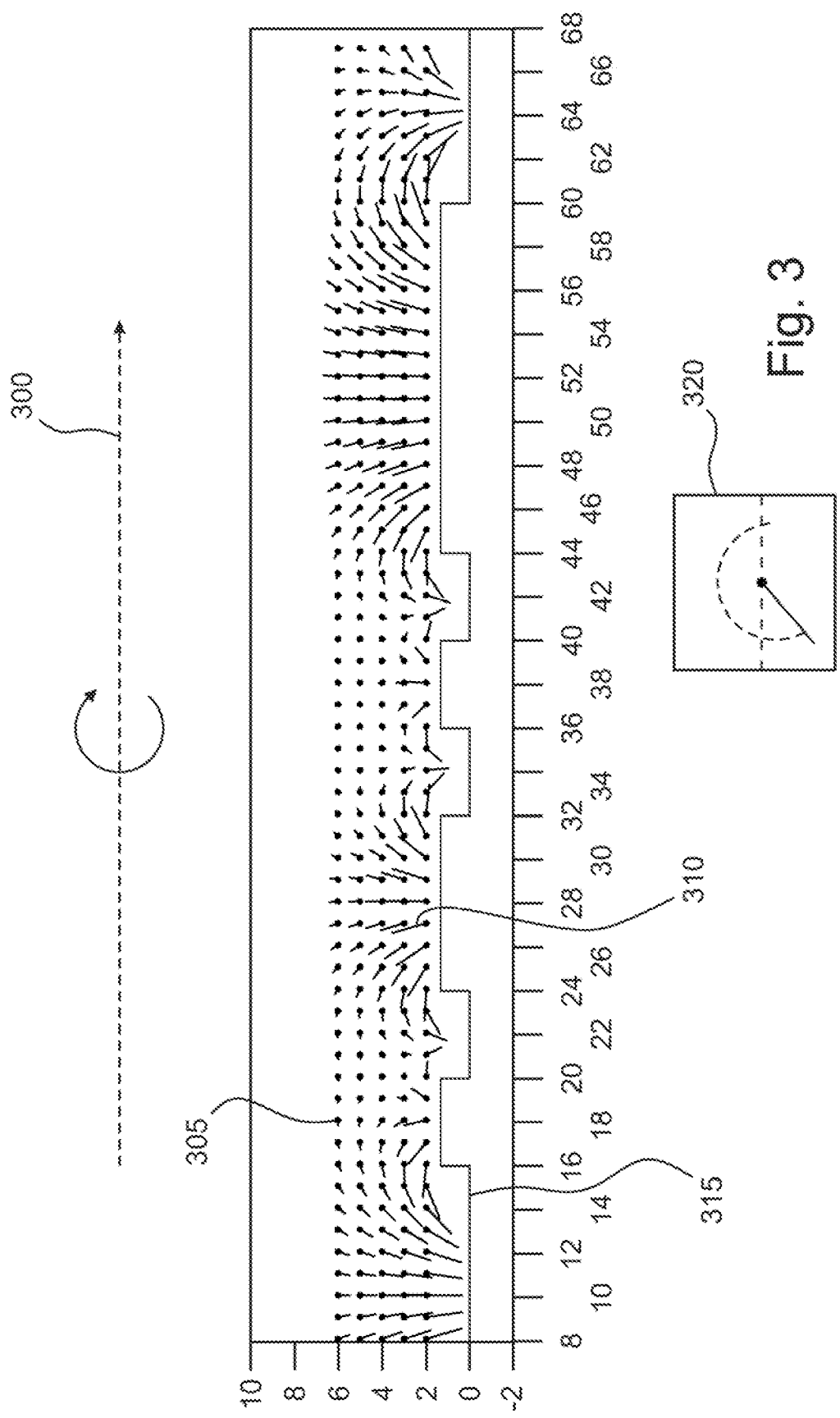
FIG. 3 shows typical changes in the magnetic field vector when moving along a code tape shown in FIGS. 2a and 2b by means of a sensor arrangement of a position detection system concerned here, on the basis of which a phase evaluation is performed.

FIG. 3 illustrates the magnetic field vector resulting when moving along a code tape shown in FIGS. 2a and 2b in the shown x-direction 300 by a sensor arrangement according to the invention. The points 305 included in the diagram indicate the respective position of the scanning. The lines 310 also shown there are in each case aligned in the direction of the field vectors occurring, during magnetic induction, corresponding to the possible phase values 320 indicated below the diagram. The length of the lines has been normalised to the maximum of the absolute field values present.

The step-shaped line 315 drawn in the lower part of the diagram corresponds to the magnetic code resulting from the scanning. The angle of the magnetic induction vectors is measured with respect to the x-axis. In the following, this angle is referred to as the phase angle or phase of the magnetic induction vectors.

At any distance of the sensor elements from the respective code tape (namely in the vertical z-direction shown in FIG. 1), wherein this distance should not be greater than the longitudinal dimension of a magnetic code bit, the magnetic induction vector rotates in a negative direction when the sensor elements move from left to right, i.e. clockwise in the present representation. Above code bit boundaries with alternating (bit) polarity, the field is substantially horizontal. At greater distances, however, certain bits are difficult or impossible to detect or measure due to the broadening of the magnetic field distribution of the individual magnetic code bits (see the bits contained in the top line).

FIG. 4a illustrates typical measurement curves for the phase transitions at the code bits detected in each case. Here, the curved line 400 corresponds to the phase progression of the magnetic induction vector along the (horizontal) position on the code tape and the step-shaped line 405 corresponds to the corresponding value of detected magnetic code bits.

If the sensor arrangement or the sensor head moves from left to right over the respective target object, e.g. a magnetic code tape, a dipole magnet, or the like, then the magnetic induction vector rotates in a negative direction, i.e. clockwise in the present case. The phase progression 400 now has characteristic features which correspond to the structure of the magnetic code tape. Plateau-shaped phase progression areas 410 correspond to longer, magnetically homogeneous sections. At magnetic transitions 415 between poles or pole areas of different polarity, however, the respective code bits are inverted. Therefore, it is possible to determine the respective magnetic bit sequence in the present case by means of a "reverse analysis".

In FIG. 4b, a code tape bit pattern 420 is depicted in the upper part of the diagram shown, wherein 425 and 430 represent the respective x and z components of a corresponding regular (and already equalised) signal detected by the sensors. A detected binary pattern 435 is depicted in the middle of the diagram. Here, the points 440 correspond to detected bits and the point 445 to the actual reference position of the sensor. In the lower part of the diagram, a detected bit pattern 450 and a monotonic phase 455 generated from said regular signals detected by sensors are depicted.

Figure 5A:
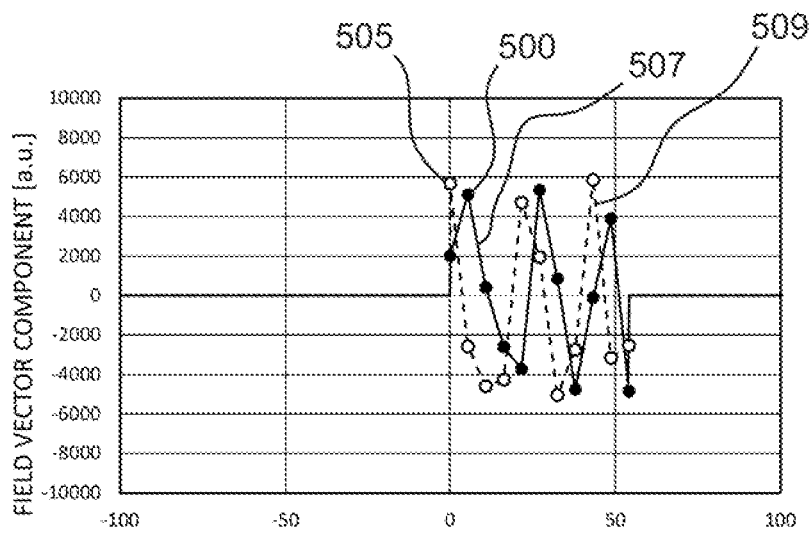
FIGS. 5a-c show an exemplary embodiment of the learning method according to the invention on the basis of typical magnetic sensor data measured on a code object concerned here, in this case in the form of a code tape, depending on the position of the sensor arrangement along the code tape.
Figure 5B:
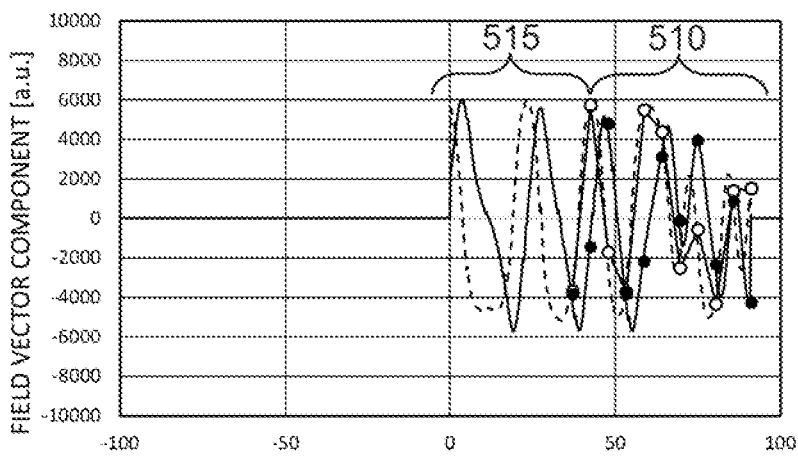
Figure 5C:
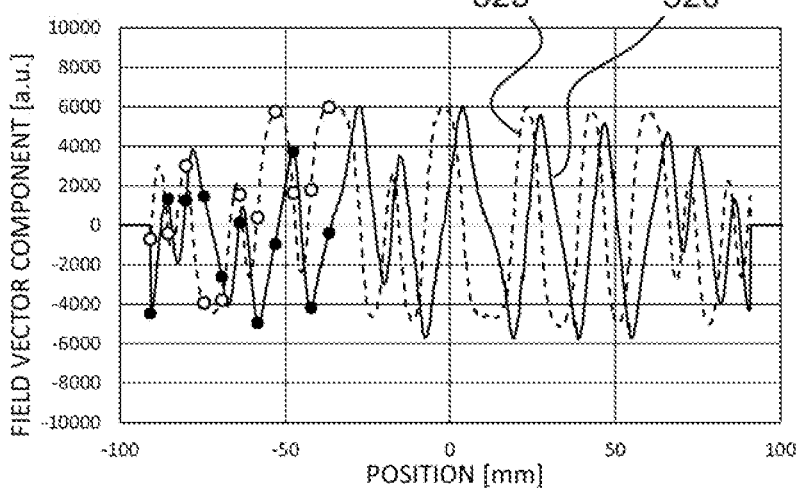

FIGS. 5a-5c show an exemplary embodiment of the learning method according to the invention using typical magnetic sensor data measured on a code tape and depending on the position of the sensor arrangement along the code tape.

According to the method, a reference table (herein referred to as a "reference map") with magnetic curve progressions or magnetic patterns is generated on the basis of sensor-detected, magnetic field vector components, in the exemplary embodiments described below the field components $B_x$ and $B_z$, as well as on the basis of phase angles of these vector components, during operation of the position detection system, i.e. during the movement of the sensor arrangement along the code object. Thus, new (local) magnetic partial patterns are learned by finding, on an existing map, already existing partial patterns corresponding or correlating to these partial patterns by means of a similarity check and by replacing or improving or correcting these corresponding partial patterns by the corresponding currently detected partial patterns.

It should be noted here that the identification of the actual position based on dissimilarity does not depend on the number of sensitive axes of the sensor elements. This applies to both single-axis and triple-axis sensitive sensor elements.

In the present exemplary embodiment, the mentioned learning process comprises the following four process steps based on a said already existing reference map:

1. Reading out the existing reference map for the code object concerned in each case (note: an individual reference map is created for each code object).

2. Finding a partial pattern in the reference map by means of a correlation calculation, wherein this partial pattern is as similar as possible to a currently measured partial pattern or a corresponding magnetic curve progression, 3. Learning new or correspondingly changed patterns or corresponding complete curve progressions by mathematical interpolation, and 4. Idealisation of the thus changed patterns or curve progressions on the basis of given, physical models for a magnetic system concerned here, and corresponding renewal of the already existing reference map.

This procedure has the advantage that the position detection system can already be operated in normal mode even during the learning process, and that the system can preserve or even improve its measurement properties, even in the case of strongly changing external conditions (e.g. due to a parasitic magnetic field described below), as a result of the learning process.

In FIGS. 5a-5c, field vector components $B_x$ (black dots) 500 and $B_z$ (white dots) 505 detected by sensors on a code tape are depicted in arbitrary units above the actual position in each case in the unit [mm] of the sensor arrangement along the code tape. The lines 507, 509, also drawn in, correspond to simple connecting lines between the measuring points, depicted differently for each of the two field components ($B_x$: bold, $B_z$: dashed).

It should be noted that the number of points 500, 505 shown in FIGS. 5a-5c in the present example is 11 (eleven), corresponding to a sensor arrangement 100 shown in FIG. 1 with only eleven (11) sensor elements 110, wherein the distance between the individual sensor elements in the present exemplary embodiment is around 1.38 times greater than the bit length.

Thus, FIG. 5a shows currently detected spatially limited (local) partial patterns (point distributions) or corresponding curve progressions for the two field vector components. These patterns or corresponding curve progressions are stored or saved on the reference map.

In the measurement situation shown in FIG. 5b, the sensor arrangement has moved around 40 mm to the right above the code tape. This results in the shown further partial patterns or corresponding curve progressions for the two field vector components. This further reference data is also stored on the reference map in the present exemplary embodiment.

In the measurement situation shown in FIG. 5c, the sensor arrangement above the code tape has moved around 130 mm to the left, starting from the last position according to FIG. 5b. This results in the shown still further partial patterns or corresponding curve progressions 510 for the two field vector components. This further data is also stored on the reference map, in addition to the data 515 already stored.

This results in the progressions of the two field vector components $B_x$ and $B_z$ depicted in FIG. 5c by the solid line 520 and the dashed line 525 for the present code tape as a whole.

FIGS. 6a-6e show the creation of a first map with complete progressions of the two field vector components $B_x$ and $B_z$ along the whole code tape, starting from the (local) partial pattern of the two magnetic field components 500, 505 shown in FIG. 5a. In addition, the creation of a second map with corresponding phase angles is shown from this data.

From the point values 500, 505 (FIG. 6a), the phase shifts or corresponding phase angles of the measuring points in the unit 'rad' (FIG. 6b) between the measured two field vector components are calculated depending on the position of the sensor arrangement by respective difference formation.

Figure 6A:
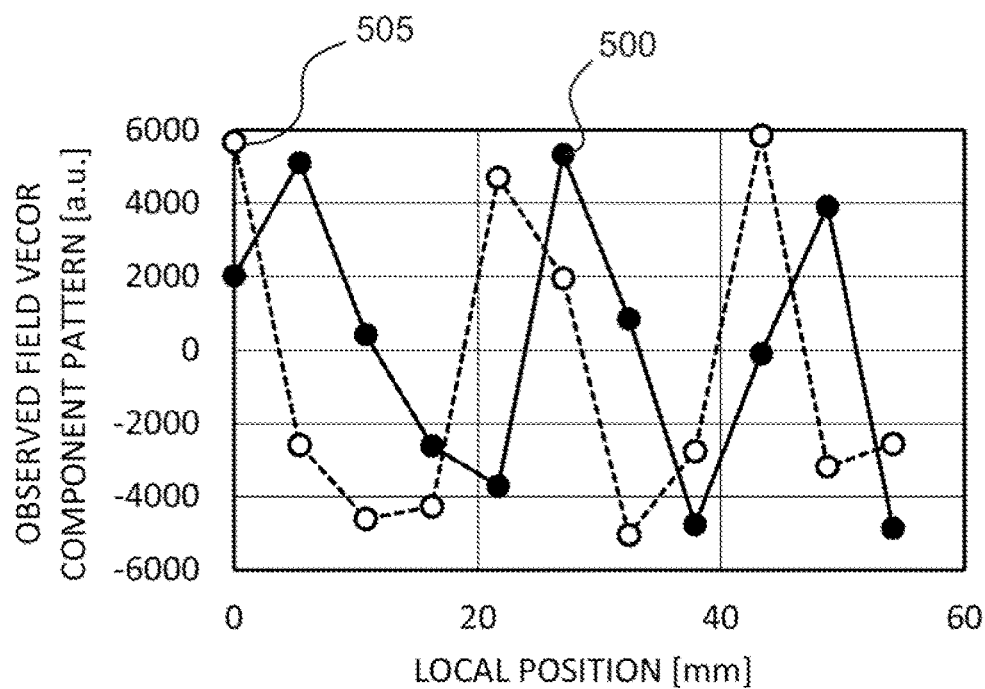
FIGS. 6a-e show the creation of a first map from magnetic field components detected by sensors and a second map with phase angles obtained from the detected sensor data.
Figure 6B:
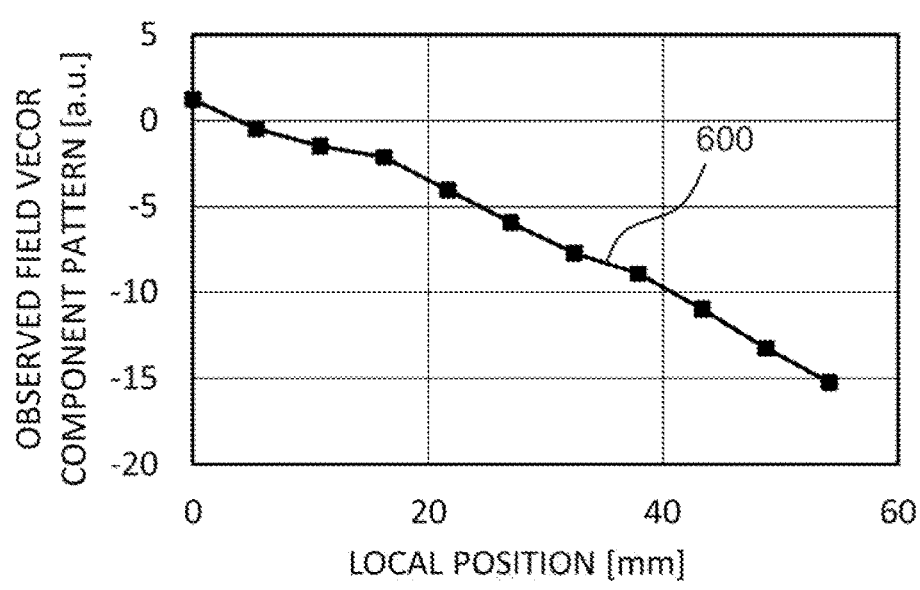

By moving or traversing the sensor arrangement along the entire code tape in the manner shown in FIGS. 5a-5c, the complete, first reference map (FIG. 6c) of the two magnetic field vector components is generated. Correspondingly, the second reference map for the phase course or phase shift 615 between the two field vector components along the entire code band is generated (FIG. 6d). In this depiction, the local phase course 600 according to FIG. 6b is delineated or highlighted by a window 620.

Figure 6C:
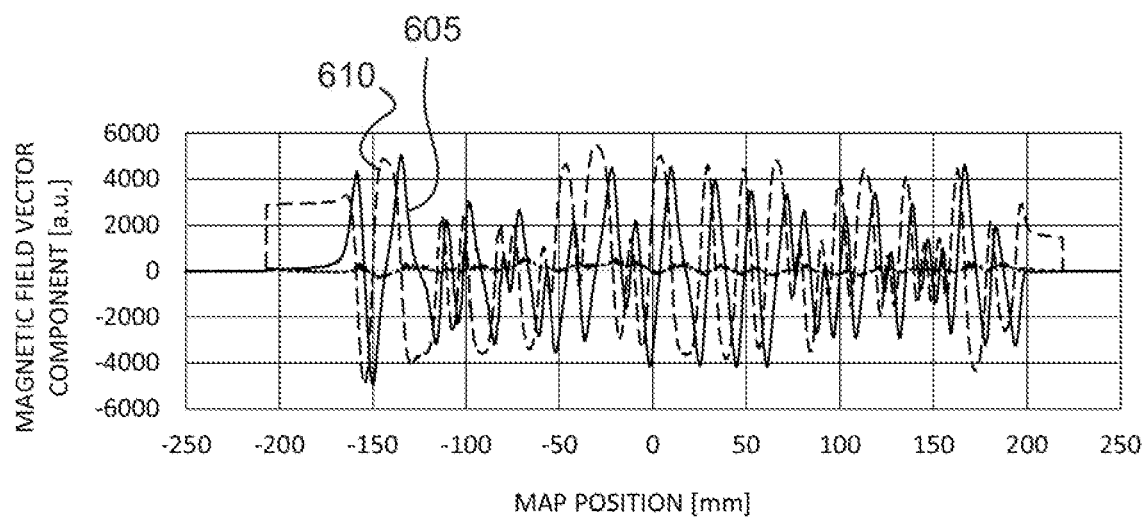
Figure 6D:
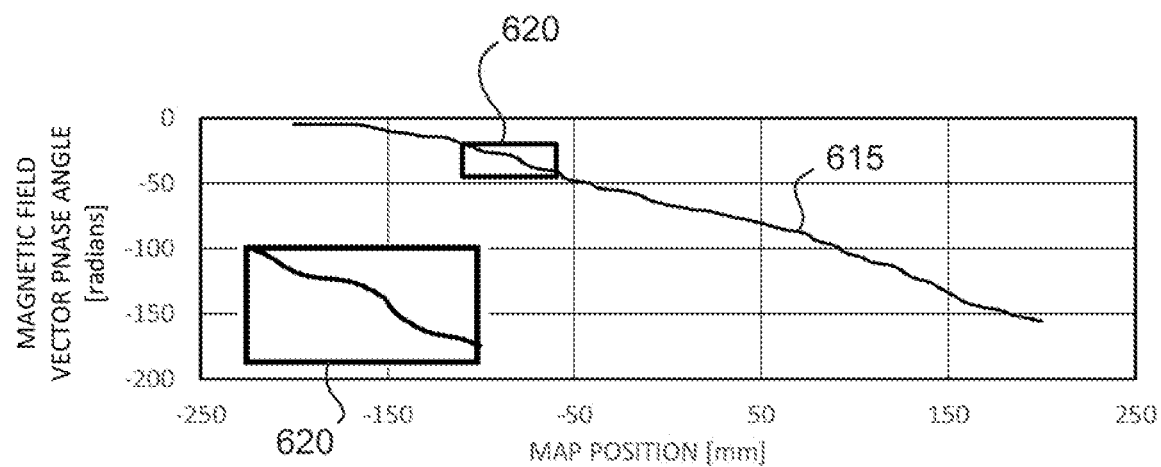
Figure 6E:
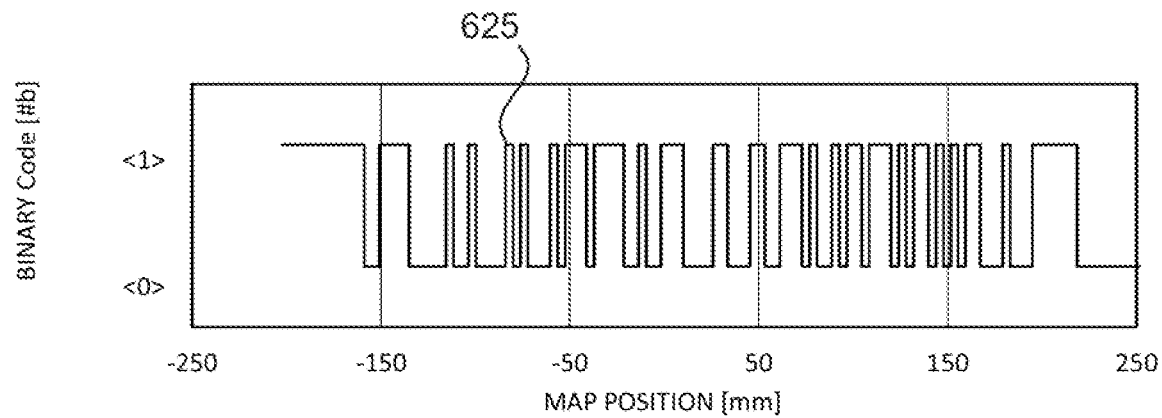

From the two phase-shifted curve progressions 605, 610 for the two field vector components $B_x$ and $B_z$ shown in FIG. 6c, a corresponding bit pattern 625 is calculated or formed, taking into account the phase progression 615. The (binary) bit sequence 630 emerging in the present example is also listed above the bit pattern 625. This is because these two field components represent almost harmonic conjugates and can therefore preferably be brought into as good a phase-related match or overlap as possible by means of a linear integral transformation, e.g. the integrally known "Hilbert transformation", so that they can thereby be evaluated together with regard to the determination of a corresponding bit pattern.

It should be noted here that the joint evaluation is also possible if the sensor elements each have only one sensitive direction. Thus, in the case of sensor elements sensitive to only one field vector component, e.g. Bx, the course of the respective other field component, in this case Bz, can be at least approximately calculated or simulated from the course of the field vector component Bx by a Hilbert transformation.

FIGS. 7a-7d show a method for finding a partial pattern stored on a map by means of a similarity check. Here, the position detection system determines the position of the sensor arrangement relative to the code tape by finding the part or partial pattern stored on the reference map that has the greatest similarity to a currently sensor-detected partial pattern. In the present exemplary embodiment, the similarity is calculated using the known method of the least deviation or error squares. However, other known correlation methods, such as the methods mentioned at the beginning, can also be considered.

FIG. 7a shows a code tape 700, assumed here and having only one track, which has an irregular sequence of magnetic poles 108, 108 shown in FIG. 1.

FIG. 7b again shows only locally detected sensor signals for currently detected sensor data 705 (black dots) and for sensor data 710 (white dots) stored on the reference map and very similar to the current sensor data 705, both values in arbitrary units, and in fact depending on the relative position in [mm] between the sensor arrangement and the code tape (see FIG. 1). The two measurement curves, again generated by simple connecting lines between the measuring points, show a clearly visible high match.

In contrast, FIG. 7c shows sensor data 715 (black dots) currently detected locally at a different position on the reference map and corresponding data 720 (white dots) stored at this position on the reference map, both values again in arbitrary units. However, compared to FIG. 7b, considerable deviations between the two curves can be seen.

FIG. 7b shows a dissimilarity curve 725 calculated mm the matching results according to FIGS. 7b and 7c, which can be used to determine the position on the reference map with the highest degree of matching. Thus, local values according to FIG. 7b result in relatively low values of dissimilarity, and local values according to FIG. 7c result in relatively high values of dissimilarity. In the present example, the two partial patterns shown in FIG. 7b result in an extremely low value 730 of dissimilarity due to the relatively high degree of matching.

As a result, the current code tape position is assumed to be the position concerned on the reference map with the partial pattern shown in FIG. 7b as the most probable current position of the sensor arrangement with respect to the code tape.

Finally, FIGS. 8a-8g show typical measurement curves to illustrate the robustness of the described method with respect to an external magnetic dipole field present only locally in the vicinity of the code tape in the tape direction of the code tape or the corresponding parasitic interference field.

Figure 8A:
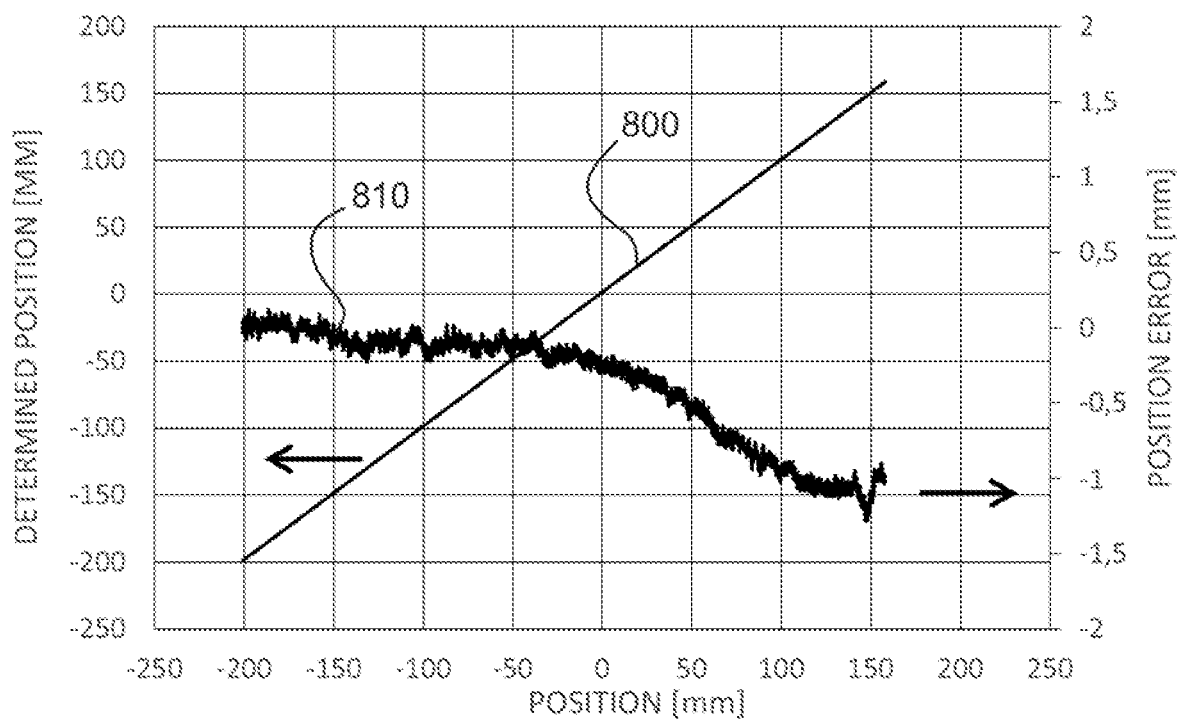
FIGS. 8a-g show exemplary measurement curves illustrating the immunity or robustness of the method according to the invention to an external magnetic field present near the code tape.
Figure 8B:
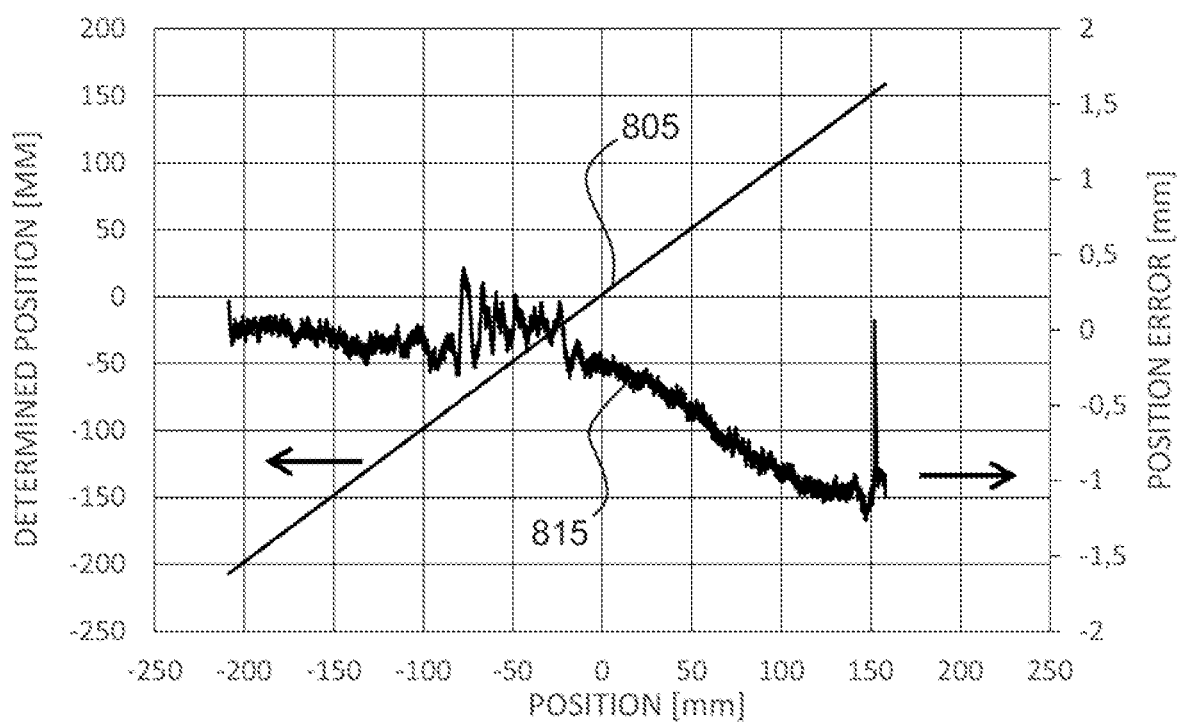

FIGS. 8a and 8b show characteristic curves 800, 805 of the sensor arrangement concerned here, in which positions determined using the method described (y-axis) are plotted against actual positions (x-axis) in respective units [mm]. The two diagrams also show curve progressions 810, 815 (each in arbitrary units) of the relative position deviations which occurred between the determined and the actual position data.

FIG. 8a shows the situation without the aforementioned interference field and FIG. 8b shows the situation with the presence of the interference field. As can be seen by comparing the two characteristic curves 800, 805, the influence of the interference field on the characteristic curve 800 of the sensor arrangement is relatively small or negligible.

Figure 8C:
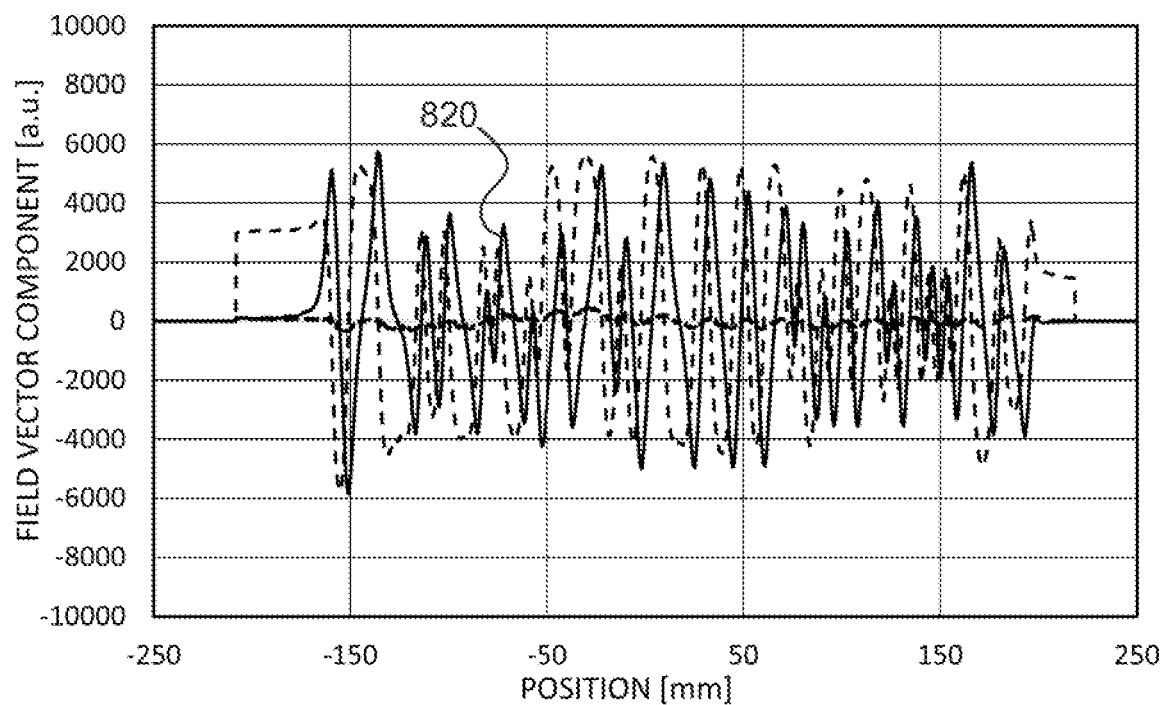
Figure 8D:
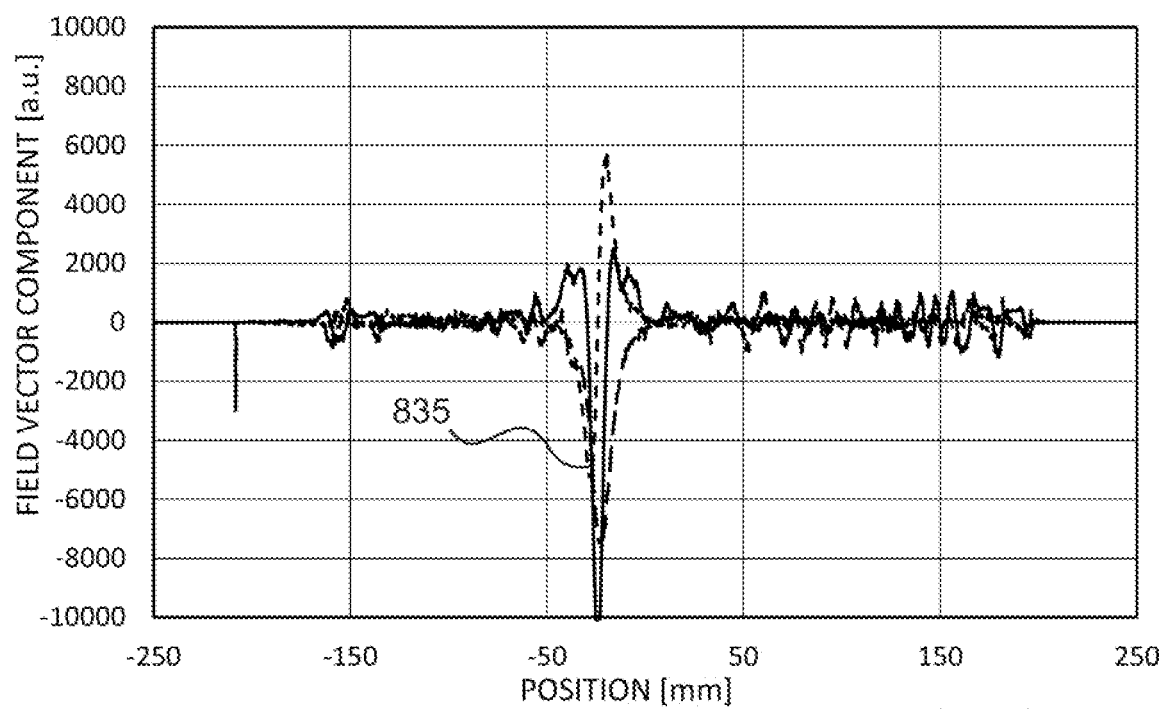
Figure 8E:
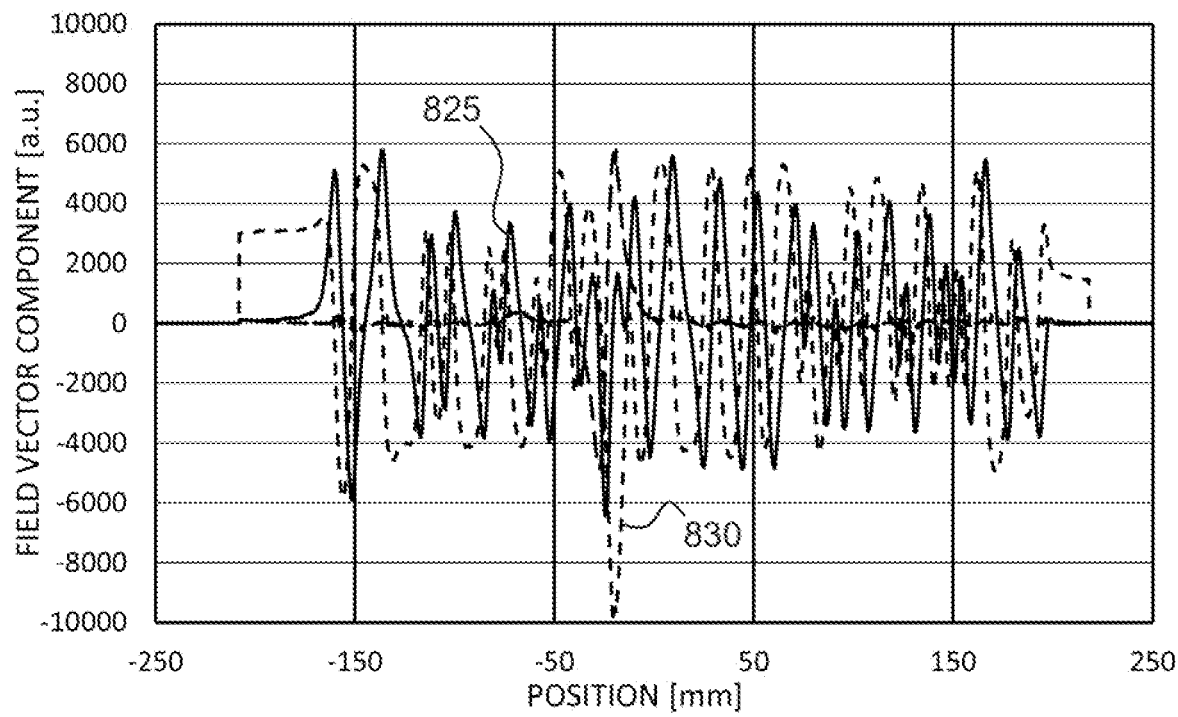

FIGS. 8c-8e show phase-shifted curves 820, 825 for the two field vector components $B_x$ and $B_z$ already depicted in FIG. 6c, and indeed in FIG. 8c without a so-called parasitic interference field and in FIG. 8e in the presence of such an interference field. In this case, the curve progression 825 was relearned during the contact of the interference field in the manner described. It should be noted that the difference 830 between the two curves 820, 825 corresponds substantially to the field course 835 of the interference field shown in FIG. 8d, which was also detected by means of the sensor arrangement.

Figure 8F:
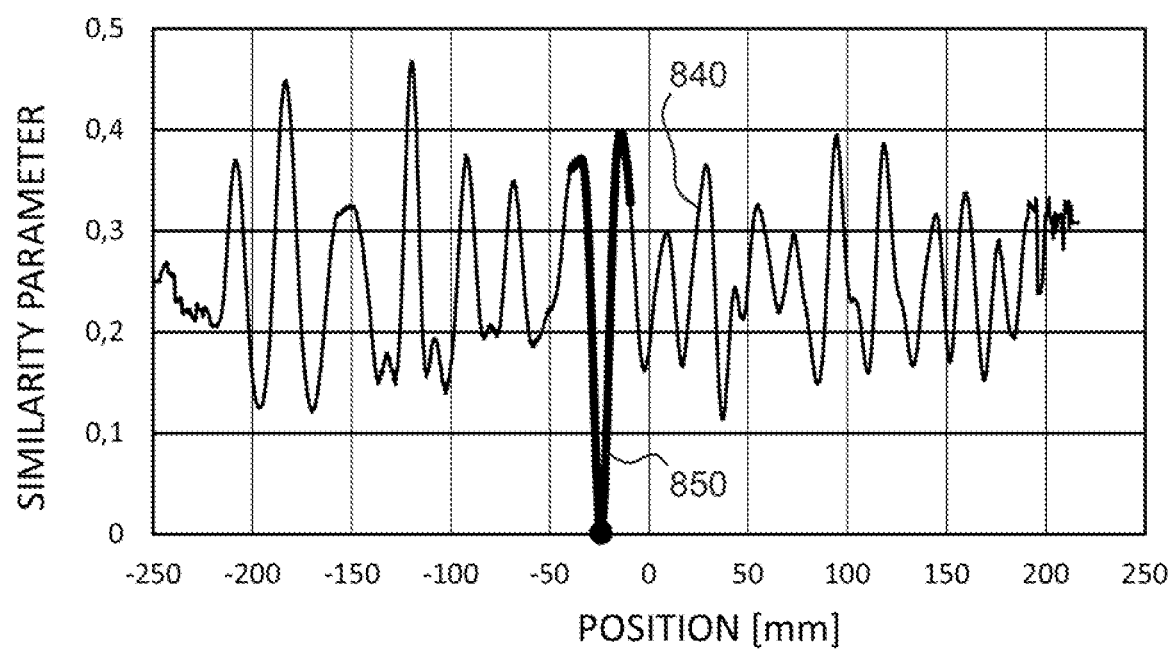
Figure 8G:
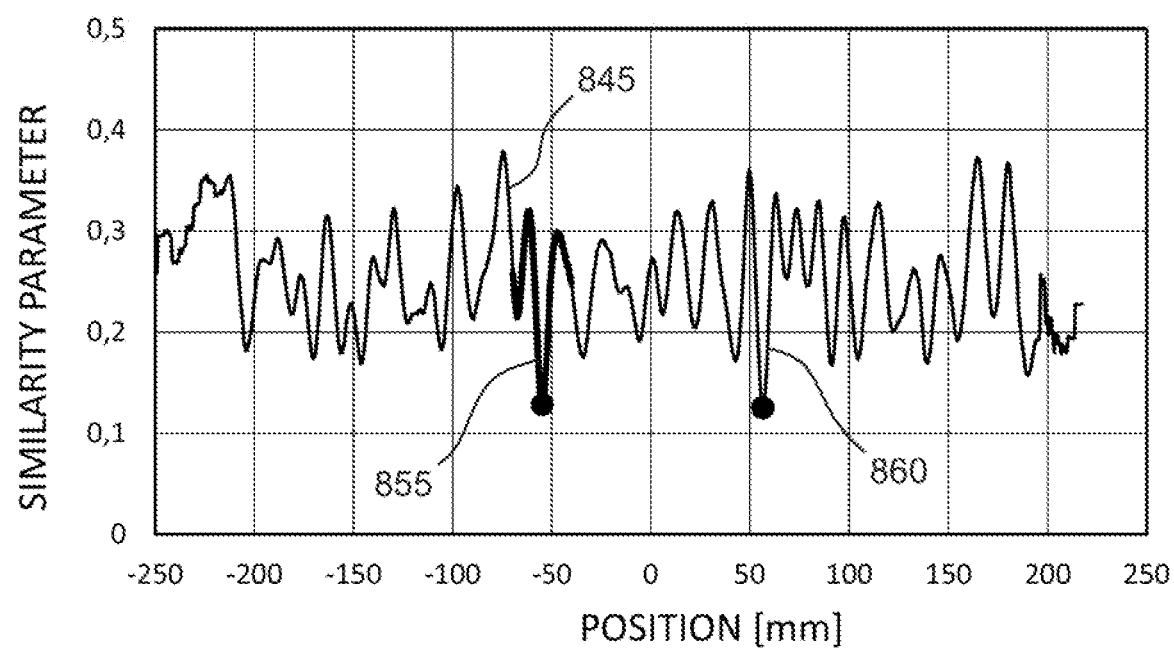

In FIGS. 8f and 8g, non-similarity curves 840, 845 already shown in FIG. 7d are depicted, and indeed in FIG. 8f without the presence of the interference field and in FIG. 8g with the presence of the interference field, wherein a reference map (with the corresponding, curve progressions) created in a situation not disturbed by the parasitic interference field is used as a basis for creating the non-similarity curve 845. In the first non-similarity curve 840, a minimum 850 with the value zero of non-similarity (and thus a maximum of similarity) occurs at the position −25 mm of the code tape, whereas in the second non-similarity curve, minima 855, 860 occur at the two positions −53 mm and +55 mm of the code tape, but with the non-similarity value 0.12. Accordingly, even in the presence of the interference field, a curve progression of the non-similarity curve 845 emerges, which is thoroughly evaluable and yields an absolute position value. In the case of a closer look, the position 855 would even be selected, which is relatively close to the position 850, since the minimum value at the position 855 is slightly higher than the minimum value at the position 860.

The invention claimed is:

1. Method for operating an absolute measuring position detection system having a sensor arrangement (100) and a single-track magnetic code object (105) with non-repeating code areas, wherein the sensor arrangement (100) is formed by a substantially linear arrangement of a plurality of magnetic field sensors (110), the method comprising:
determining a relative position of the sensor arrangement (100) with respect to the respective code object (105) by searching for a partial pattern (710, 720) of a detected magnetic field signal of a present complete measurement curve which is most similar to a predetermined pattern previously stored in a reference map based on magnetic curve progressions or magnetic patterns of magnetic field vector components (500, 505) detected by sensors for the entire code object (105) depending on the position on the code object (105).

2. Method according to claim 1, searching for a position of the sensor arrangement (100) on the code object (105) at which a deviation between the previously stored partial pattern and the currently sensor-detected partial pattern forms a minimum and comparing the respective partial patterns.

3. Method according to claim 2, characterised in that the deviation is formed as a square deviation between the two partial patterns (705-720).

4. Method according to claim 2, characterised in that the deviation is formed as a sum of absolute values of a difference between corresponding values of two partial patterns.

5. Method according to claim 2, characterised in that the deviation is determined by means of an artificial neural network as a square or absolute value of a distance between the detection positions of two partial patterns estimated by the artificial neural network.

6. Method according to claim 2, characterised in that finding a minimum of the deviations between the partial patterns (705-720) to be compared for the entire code object (105) occurs on a basis of a (dis)similarity curve (725).

7. Method according to claim 1, characterised in that, during operation of the position detection system, partial patterns serving as reference data for the code object (105) are automatically learned, which, taken together, describe a course of a magnetic field along the single-track code object.

8. Method according to claim 1, characterised in that a self-diagnosis of the position detection system is carried out on a basis of determined quality values of a similarity between two partial patterns to be compared.

9. Method according to claim 1, characterised in that learned reference data are relearned in an event of any changes to the code object (105) during operation of the position detection system.

10. Method according to claim 1, characterised in that learned reference data comprises values of at least two sensor-detected magnetic field vector components (500, 505) and respective phase information (600).

11. Method according to claim 1, characterised in that the reference data are stored in a reference table or on a reference map.

12. Method according to claim 1, characterised in that a corresponding bit pattern is generated from at least two field vector components (500, 505) detected by sensors and phase-shifted with respect to each other, taking into account a phase progression (600).

13. Method according to claim 12, characterised in that the at least two phase-shifted field vector components (605, 610) detected by sensors are brought into as good a phase-related match as possible by means of a linear integral transformation in order to generate a corresponding bit pattern therefrom.

14. Absolute measuring position detection system having a sensor arrangement (100) and a single-track, magnetic code object (105) with non-repeating code regions, wherein the sensor arrangement (100) is formed by a substantially linear arrangement of a plurality of magnetic field sensors (110), characterised in that the position detection system is operable according to the method of claim 1.

* * * * *